(12) United States Patent
Park

(10) Patent No.: US 6,860,964 B2
(45) Date of Patent: Mar. 1, 2005

(54) ETCH/STRIP APPARATUS INTEGRATED WITH CLEANING EQUIPMENT

(75) Inventor: Il Ryong Park, Kumi-shi (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/740,830

(22) Filed: Dec. 21, 2000

(65) Prior Publication Data

US 2001/0050145 A1 Dec. 13, 2001

(30) Foreign Application Priority Data

Dec. 22, 1999 (KR) ...................................... P1999-60691

(51) Int. Cl.$^7$ ................................................ H01L 21/00
(52) U.S. Cl. ................................................ 156/345.31
(58) Field of Search .......................... 156/345.1, 345.2, 156/345.22, 345.31, 345.32; 119/719

(56) References Cited

U.S. PATENT DOCUMENTS

| | | | | |
|---|---|---|---|---|
| 4,185,585 A | * | 1/1980 | Shambelan | 118/50.1 |
| 5,227,001 A | * | 7/1993 | Tamaki et al. | 156/345.2 |
| 5,672,239 A | * | 9/1997 | DeOrnellas | 156/625.1 |
| 6,007,675 A | * | 12/1999 | Toshima | 156/345.22 |
| 6,210,748 B1 | * | 4/2001 | Nagahara et al. | 427/108 |

FOREIGN PATENT DOCUMENTS

| | | | | | |
|---|---|---|---|---|---|
| JP | 56017022 A | * | 2/1981 | ......... | H01L/21/306 |
| JP | 06224145 A | * | 8/1994 | ........... | H01L/21/22 |
| JP | 09106978 A | * | 4/1997 | ....... | H01L/21/3065 |
| JP | 10-189532 | * | 7/1998 | | |
| JP | 10189532 A | * | 7/1998 | ......... | H01L/21/306 |

* cited by examiner

Primary Examiner—P. Hassanzadeh
Assistant Examiner—Michelle Crowell
(74) Attorney, Agent, or Firm—Birch, Stewart, Kolasch & Birch, LLP

(57) ABSTRACT

An integrated etch/strip/clean apparatus is disclosed. The apparatus includes an etching line to etch and clean a substrate, a stripping line to strip the etched substrate, and a cleaning line to clean and dry the substrate. The cleaning line is on the stripping line. Accordingly, etch, strip and cleaning processes is performed by a single equipment. As a result, processing time installation space requirement of the equipment are reduced. Further, contamination of the substrate is prevented.

12 Claims, 3 Drawing Sheets

ETCH/STRIP APPARATUS INTEGRATED WITH CLEANING EQUIPMENT

BACKGROUND OF THE INVENTION

1. Field of the Invention

This invention relates to an apparatus for fabricating a liquid crystal display, and more particularly to combining an etch/strip apparatus with a cleaning apparatus.

2. Description of the Related Art

Generally, since liquid crystal displays (LCD) have advantages of small size, relative thinness and low power consumption, they have been used in devices such as a notebook personal computer, an office automation equipment, an audio/video equipment, etc. Particularly, active matrix LCDs, using thin film transistors (TFTs) as switching devices, are suitable for displaying dynamic images.

An active matrix LCD displays a picture corresponding to a video signal, such as a television signal, on a pixel matrix having pixels arranged at each intersection between gate and data lines. Each pixel includes a liquid crystal cell, which controls the amount of light transmitted by the cell in accordance with a voltage level of a data signal from the data line. A TFT is installed at each intersection between the gate and data lines to switch the data signal from the data line to be transmitted to the liquid crystal cell in response to a scanning signal from the gate line.

FIG. 1 shows a TFT formed on a substrate 18. A process of fabricating the TFT will be described below. First, a gate electrode 20 and a gate line is deposited on the substrate 18 with a metal such as Al, Mo, Cr or their alloy, etc. Thereafter, the gate electrode 20 and the gate line are patterned by lithography.

A gate insulating film 22, made from an organic material such as $SiN_x$ or $SiO_x$, is deposited on the substrate 18 and over the gate electrode 20. Then, a semiconductor layer 24 and an ohmic contact layer 26 are continuously deposited on the gate insulating film 22. The semiconductor layer 24 is made from amorphous silicon (a-Si) and the ohmic contact layer 26 is made from a-Si doped with n+ ions.

A source electrode 28 and a drain electrode 30 are formed on the ohmic contact layer 26. These electrodes are made from a metal such as Mo or Cr, etc. The source electrode 28 is patterned integrally with the data line. An opening between the source electrode 28 and the drain electrode 30 exposing the ohmic contact layer 26 is formed by either dry etching or wet etching.

A protective film 32, made from $SiN_x$ or $SiO_x$, is deposited on the substrate 18 to cover the TFT. Subsequently, a contact hole is formed on the protective film 32. A pixel electrode 34, made from an indium tin oxide (ITO), is coated to be connected to the drain electrode 30 via the contact hole.

Such a TFT fabricating process includes, at a minimum, a photoresist pattern formation process, an etching process, and a photoresist pattern strip process when patterning the electrode layers 20, 28 and 30 or when forming the contact hole.

FIG. 2 shows a configuration of a conventional etching, stripping and cleaning apparatus. Referring to FIG. 2, the conventional apparatus includes a loader 40, an etch module 42, a strip module 44, a stocker 46, a cleaning module 48, and an unloader 50. The loader 40 moves a substrate within a cassette (not shown) into the etch module 42 using a conveyor or a robot.

The etch module 42 etches the substrate, using an etchant, to provide a desired pattern on the TFT. The etchant is made from a mixture of MEA (mono ethanol acetone), BDG (butyl-di-glycol) and NMP (n-methyl-pyrrolidone).

The etched substrate is moved into the strip module 44 through an MGV (manually guided vehicle), an AGV (auto guided vehicle), or a CVT (clean transfer vehicle). The strip module 44 strips a photoresist formed on the etched substrate. A stripper, made from a mixture of $H_3PO_4$, $CH_3COOH$ and $HNO_3$, is used to strip the photoresist.

The stripped substrate is moved into a stocker 46 through the MGV or a CSC (clean spacer carrier). Typically, the cleaning process in the cleaning module 48 takes longer than the substrate stripping process in the strip module 44. The stocker 46 temporarily holds the substrate to synchronize the processing time between the strip module 44 and the cleaning module 48.

The stripped substrate from the stocker 46 is moved into the cleaning module 48 after a desired time. Then chemical, mechanical, and physical processes are conducted to clean the substrate. For instance, the substrate may be cleaned by a brush or by injecting de-ionized water at a high pressure.

The cleaned substrate is placed into a cassette (not shown) on the unloader 50.

As noted above, the conventional etch, strip and cleaning apparatus carries out the etching, stripping and cleaning processes using separate pieces of equipment. Thus, a long process time and a wide installation space are required.

Also, because separate pieces of equipment are used, the substrate must be moved between them. As described above, the etched substrate from the etch module 42 is moved to the strip module 44 via the MGV, the AGV, or the CVT. Also, the stripped substrate from the strip module 44 is moved to the stocker 46 via the MGV or the CSC. The substrate may be exposed and thus contamination may occur.

SUMMARY OF THE INVENTION

Accordingly, it is an object of the present invention to provide an etch/strip apparatus integrated with cleaning equipment wherein etching, stripping, and cleaning modules are unified to reduce the required installation space as well to reduce the processing time.

To achieve these and other objects of the invention, an etch/strip apparatus integrated with cleaning equipment according to an embodiment of the present invention includes an etching line for etching and cleaning a substrate; a stripping line for stripping the substrate; and a cleaning line installed on the stripping line to clean and dry the substrate.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 1:
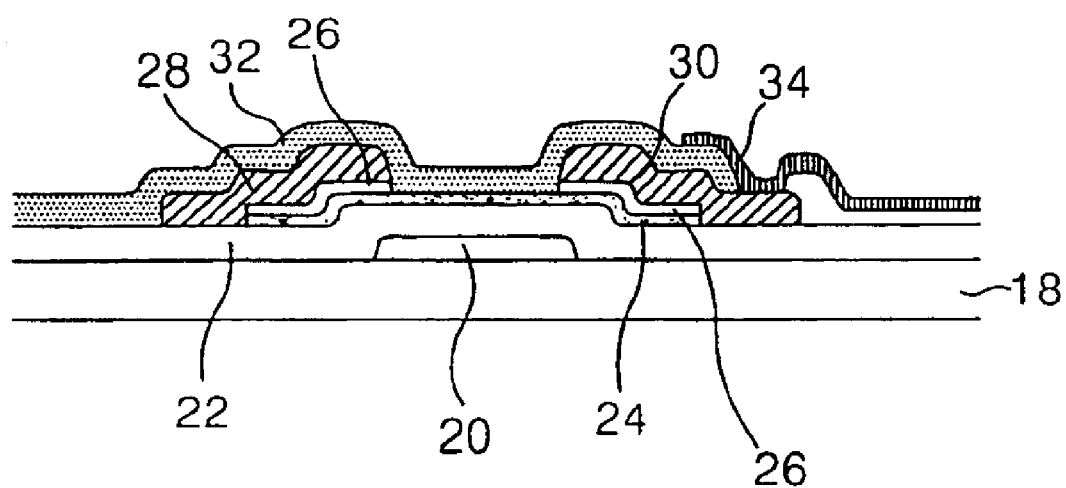
FIG. 1 is a sectional view showing a structure of a conventional thin film transistor.
Figure 2:
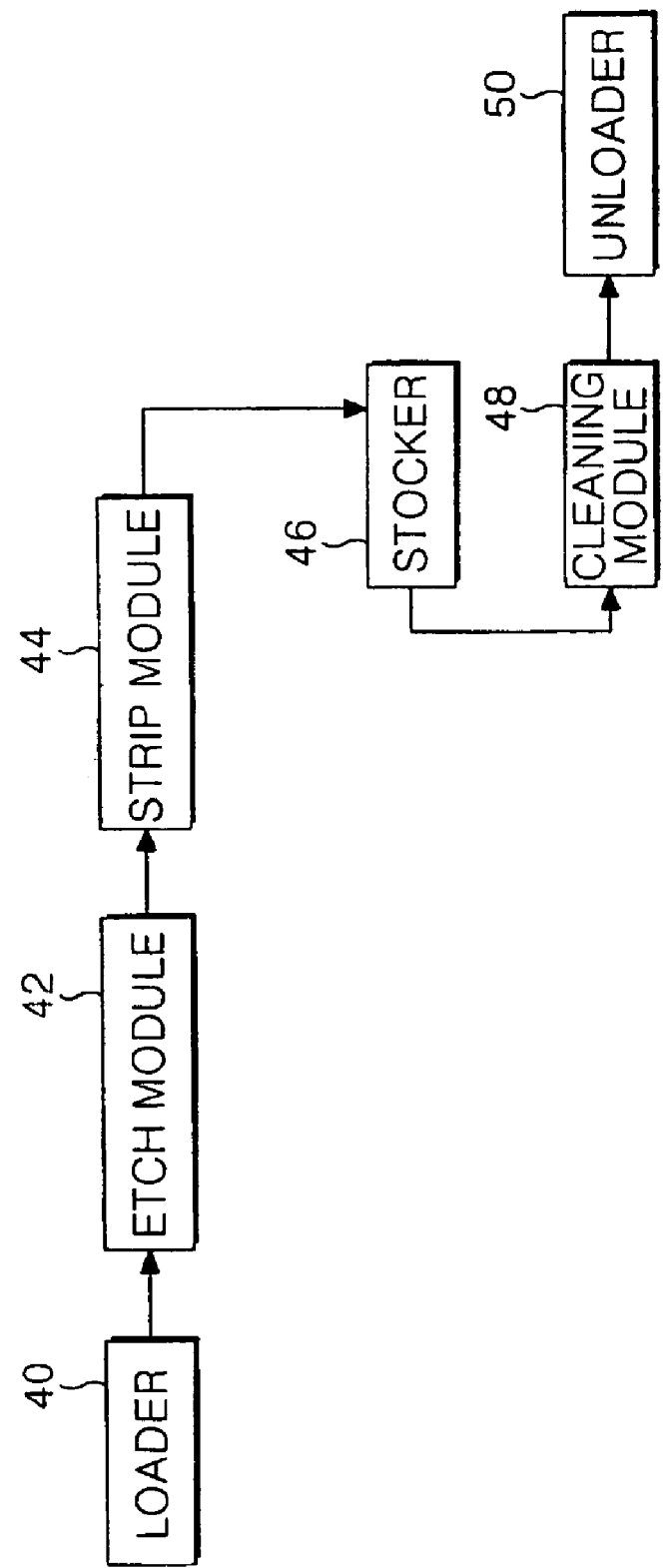
FIG. 2 is a block diagram showing a configuration of a conventional etch/strip and cleaning apparatus.
Figure 3:
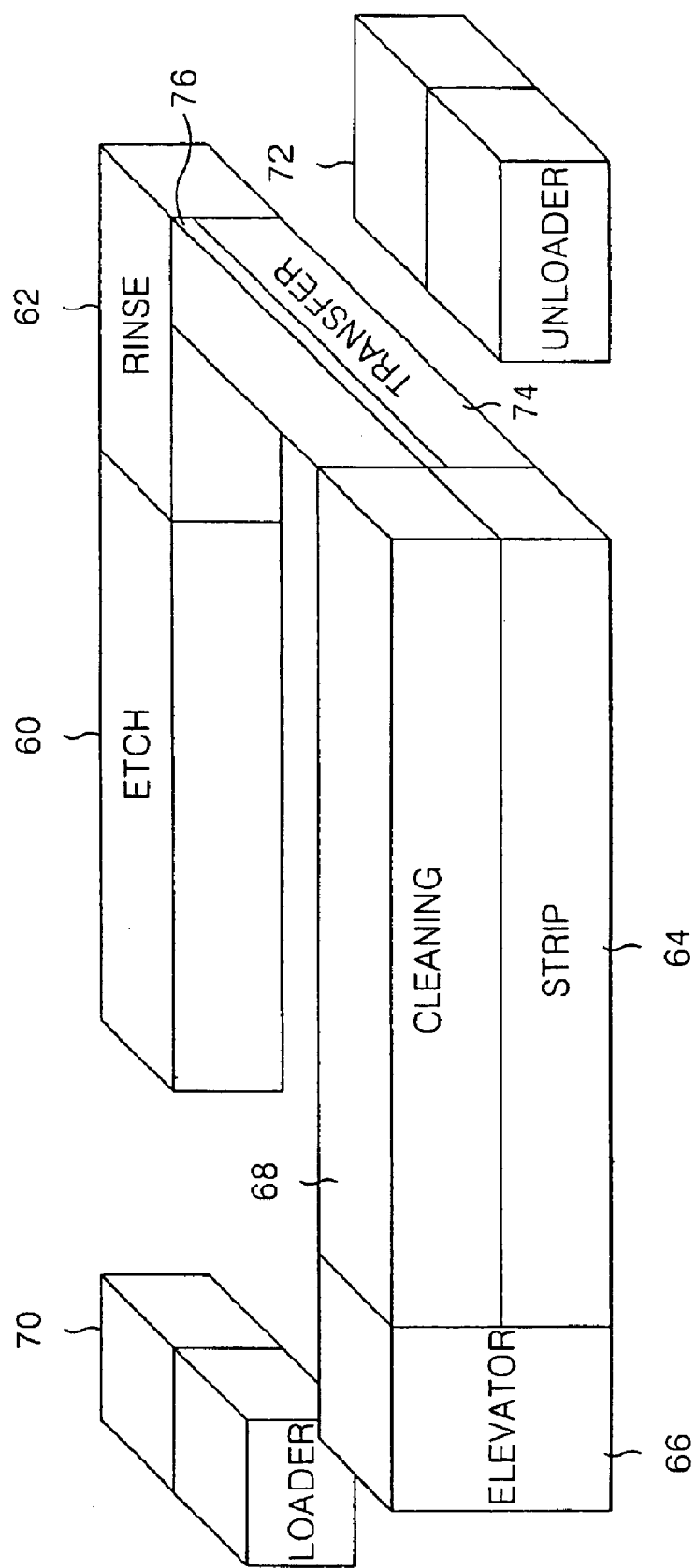
FIG. 3 is a schematic perspective view showing a structure of an etch/strip apparatus integrated with cleaning equipment according to an embodiment of the present invention.

An etch/strip apparatus unified with cleaning equipment according to an embodiment of the present invention is shown in FIG. 3. The integrated apparatus includes an etching line, a stripping line, and a cleaning line. The stripping and cleaning lines may be stacked to have a two-layer structure. The integrated apparatus includes an etch module 60, a rinse module 62, a strip module 64, and a cleaning module 68 installed on the strip module 64. The integrated apparatus also includes a transfer module 74 connecting the rinse module 62 and the strip module and an elevator 66 connecting the strip module 64 and the cleaning module 68. A loader 70 and an unloader 72 loads and unloads, respectively, the substrates from the integrated apparatus.

The operation is as follows. First, a substrate is loaded into a cassette (not shown) of the loader 70. The loader 70 moves the cassette containing the substrate into the etch module 60. A conveyor belt, robot, etc can accomplish the movement of the cassette. Note that multiple substrates can be loaded in multiple cassettes within the loader 70 and moved.

The etch module 60 etches the substrate using an etchant to provide a desired pattern on the TFT. Then, the substrate is moved into the rinse module 62. In the rinse module 62, the etchant on the substrate is cleaned using de-ionized water.

The substrate cleaned at the rinse module 62 is moved, via the transfer 74, into the strip module 64. The transfer 74 connects the rinse module 62 with the strip module 64 and includes a pipe shower 76 to prevent the substrate from drying. The strip module 64 strips the photoresist on the substrate using a stripper liquid.

The stripped substrate is moved, via the elevator 66, into the cleaning module 68. In the cleaning module 68, the substrate undergoes chemical, mechanical and physical cleaning processes. For instance, the substrate may be cleaned by a brush or by injecting de-ionized water at a high pressure. The cleaning module 68 may include a drying module to dry the cleaned substrate.

Then the cleaned substrate is received into a cassette (not shown) on the unloader 72.

As described above, according to the present invention, etching, stripping and cleaning processes are performed by a single piece of equipment. Accordingly, the processing time as well as an installation space of the equipment can be reduced. Further, because the substrate is kept within one piece of equipment, it is not exposed to be contaminated.

Although the present invention has been explained by the embodiment shown in the drawings described above, it should be understood to one of ordinary skill that the invention is not limited to the embodiment, but rather that various changes or modifications thereof are possible without departing from the spirit of the invention. Accordingly, the scope of the invention shall be determined only by the appended claims and their equivalents.

What is claimed is:

1. An apparatus for processing a substrate, the apparatus being formed by combining etching and stripping equipment with cleaning equipment, the etching and cleaning equipment being comprised of modules joined end to end to form a unified structure, wherein the substrate is moved directly out of one of the modules into another one of the modules in succession, the unified structure comprising:

an etching line comprising an etch module joined end to end with a rinse module for etching and rinsing the substrate prior to stripping;

a stripping line for stripping the substrate, the stripping line being connected to the etching line;

a transfer module having an end thereof directly joined to an end of the etching line and an end thereof directly joined to the stripping line, for moving the substrate from the etching line to the stripping line with no exposure of the substrate to the outside of said unified structure;

a cleaning line installed on the stripping line to clean and dry the substrate; and an elevator for conveying the substrate from the stripping line to the cleaning line, wherein, the unified structure is sequentially arranged in the order the etching line, the transfer module, the stripping line, the elevator and the cleaning line.

2. The apparatus as claimed in claim 1, further comprising:

a loader for moving the substrate to the etching line; and an unloader for receiving the substrate from the cleaning line.

3. The apparatus as claimed in claim 2, wherein:

the etch module etches the substrate;

the substrate is moved from the etch module into the rinse module; and the rinse module cleans the substrate.

4. The apparatus as claimed in claim 1, wherein the stripping line and the cleaning line are stacked to have a two-tier structure.

5. An apparatus for processing a substrate, the apparatus including etching, stripping and cleaning equipment forming a unified structure comprised of modules joined together end to end, such that the substrate is not exposed to the outside of any of the modules during processing, the unified structure comprising:

an etching line comprising an etch module having an end thereof joined to a rinse module, for etching and cleaning the substrate;

a stripping line for stripping said substrate, said stripping line being unified with said etching line through a transfer module, wherein said transfer module moves the substrate from said etching line to said stripping line while preventing the substrate from drying;

a cleaning line integrated with said stripping line to clean and dry the substrate; and an elevator to transfer said substrate from said stripping line to said cleaning line, wherein, the unified structure is sequentially arranged in the order the etching line, the transfer module, the stripping line, the elevator and the cleaning line.

6. The apparatus of claim 5, wherein said cleaning line is installed on said stripping line.

7. The apparatus of claim 5, wherein the rinse module is connected to said etch module.

8. The apparatus of claim 5, wherein said preventing the substrate from drying is accomplished by a pipe shower providing a fluid on the substrate.

9. The apparatus as claimed in claim 5, wherein the stripping line and the cleaning line are stacked to have a two-tier structure.

10. The apparatus of claim 5, further comprising:

a loader for loading the substrate to the etching line; and an unloader for unloading the substrate from the cleaning line.

11. The apparatus of claim 9, wherein said loader includes at least one of a conveyor and a robot.

12. The apparatus of claim 9, wherein said unloader includes at least one of a conveyor and a robot.

* * * * *